United States Patent [19]

Kamada

[11] Patent Number: 4,573,104
[45] Date of Patent: Feb. 25, 1986

[54] ASSEMBLING CONSTRUCTION OF ELECTRONIC APPARATUS

[75] Inventor: Koichiro Kamada, Osaka, Japan

[73] Assignee: Omron Tateisi Electronics Co., Kyoto, Japan

[21] Appl. No.: 563,528

[22] Filed: Dec. 20, 1983

[30] Foreign Application Priority Data

Dec. 21, 1982 [JP] Japan .................. 57-193620[U]

[51] Int. Cl.$^4$ ................................ H05K 5/00
[52] U.S. Cl. ........................ 361/399; 211/41; 312/257 R; 312/258; 361/394; 361/415
[58] Field of Search ............... 174/53; 211/41; 248/27.3, 221.3, 221.4; 339/17 LM, 17 M, 193 P; 361/380, 394, 395, 399, 412, 413, 415; 312/108, 257 R, 258 A; 208/53.1, 55.3, 109, 153, 159

[56] References Cited

U.S. PATENT DOCUMENTS

| | | | |
|---|---|---|---|
| 2,777,893 | 1/1957 | Rosso | 361/399 |
| 2,958,013 | 10/1960 | Ansley | 361/395 |
| 3,668,476 | 6/1972 | Wrabel et al. | 361/413 |
| 4,023,871 | 5/1977 | Dantzler | 312/108 |
| 4,399,487 | 8/1983 | Neumann | 361/399 |

OTHER PUBLICATIONS

Futatsugi et al., "IBM Technical Disclosure Bulletin", vol. 23, No. 12, 5/81, pp. 5433-5434.

Primary Examiner—Patrick R. Salce
Assistant Examiner—Gregory D. Thompson
Attorney, Agent, or Firm—Wegner & Bretschneider

[57] ABSTRACT

An assembly of electronic apparatus housed in a case is assembled so that a pair of opposed panels associated with the case are integrally connected through a circuit board. Pillar-like portions having guide grooves and engaging shoulders associated therewith are projectingly provided on each of the panels. The circuit board is formed with engaging portions which are inserted into the guide grooves and which come into abutment with the engaging shoulders for removal engagement. The pillar-like portions are subjected to elastic distortion as the engaging portions are inserted into the guide grooves. The pillar positions resiliently return to their original state and bring the engaging shoulders into abutment with the engaging portions.

6 Claims, 3 Drawing Figures

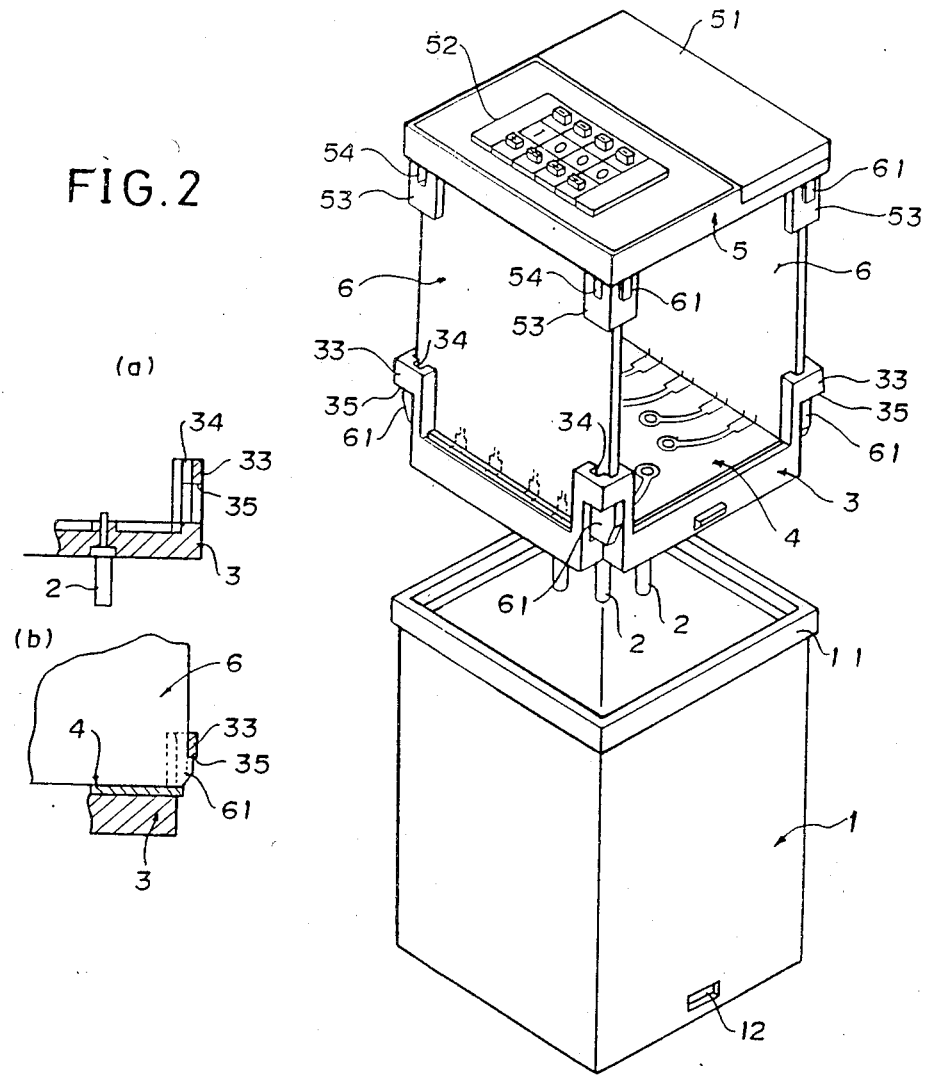

ASSEMBLING CONSTRUCTION OF ELECTRONIC APPARATUS

BACKGROUND OF THE INVENTION

This invention relates to, an electronic apparatus having a pair of opposed panels and to an assembling constructed of panels which are connected through print boards in a one-touch manner.

This invention is an improvement on an electronic apparatus in which a display panel is provided on the front surface of a case both ends of which are open. The apparatus has a base panel having connecting terminals arranged on the rear surface thereof, has panels which are integrally connected through circuit boards disposed between both the panels, and has an assembly of these panels and boards which is fitted in the opening of the case to complete assembly. The circuit board has a function as a board on which electronic parts are mounted and in addition functions as a spacer for integrally assembling the display panel and the base panel, which are fitted into the case. Generally, the circuit board is secured to the base panel or the display panel by providing rib-like projections on a part of the panel, forming holes in said projections, and securing the circuit board into the holes through screws or like. Further, at least two circuit boards are opposedly provided around the panel, and eight screws at the minimum are required. Therefore, assembling is extremely troublesome and many steps of operation are required.

SUMMARY OF THE INVENTION

It is an object of the present invention to provide an electronic apparatus assembly constructed whereby a pair of opposed panels are connected together through printed circuit boards in a one-touch manner.

In accordance with the present invention, ends of circuit boards can be secured in position to panels merely by pressing the ends thereof. Therefore, assembly can be accomplished very easily as compared with the prior art use of screws. Moreover, in assembling, the boards need not be located with respect to the panels because the spacing between the panels can be obtained with high accuracy merely by the pressing operation.

It is a further object of the present invention to provide an assembly constructed of standardized structural electronic parts.

In accordance with the present invention, by varying the arrangement mode of a pair of opposed panels, circuit boards can be changed in arrangement. As a consequence, parts can be standardized.

BRIEF DESCRIPTION OF THE DRAWINGS

FIGS. 2(a) and (b) are sectional views showing the fitting of circuit boards at circle A in FIG. 1.

FIG. 3 is an exploded perspective view showing a completed assembly of the circuit board and both panels.

DETAILED DESCRIPTION OF THE INVENTION

Figure 1:
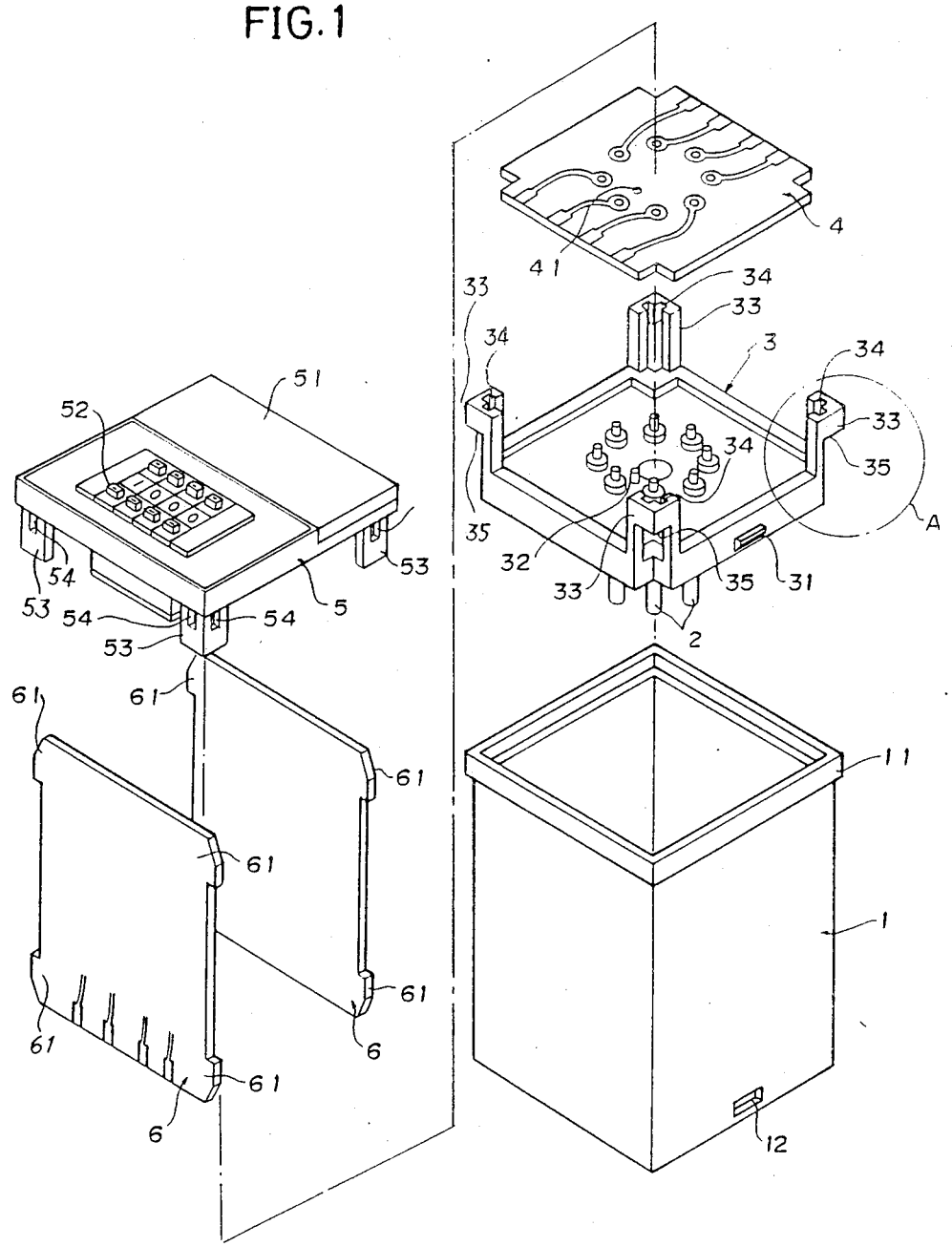
FIG. 1 is an exploded perspective view showing the construction in which the present invention is applied to a plug-in type temperature controller.

FIG. 1 shows the construction of the present invention which is applied to a plug-in type temperature controller. This temperature controller comprises a box-shaped case 1 both ends of which are open, a base panel 3 having a plurality of circularly arranged connecting terminl plugs 2, a base board 4 mounted on the inner bottom of the base panel 3 and connected to each of the terminal plugs 2, a display panel 5 mounted on the opening in the front surface of the case 1, and a pair of circuit boards 6, having one end mounted on the peripheral edge of the display panel 5 and the other end mounted on the base panel 3.

The opening in the front surface of the case 1 is formed with a flange 11 spread to match with the peripheral edge in the rear surface of the display panel 5, and engaging holes 12 are formed in both sides at the rear of the case 1.

Projectingly provided on both sides of the base panel 3 are engaging pawls 31 which are resiliently engaged with the engaging holes 12 to prevent disengagement. Projectingly provided on the inner bottom of the base panel 3 is a pin 32 which engages locating hole 41 formed in the base board 4 to locate the latter.

Elastic pillar-like portions 33 are integrally provided upright at four corners of the base panel 3, as shown in FIG. 1 and FIG. 2. These pillar-like portions 33 are respectively formed with guide grooves 34 which are provided along by the pillar-like portion in an up-and-down direction. The guide grooves extend along the length of the pillar-like portions and perpendicular to the plane of said panels. Each of the pillar-like portions 33 is cut at its lower portion, said cut serving as an engaging shoulder 35.

The base board 4 is formed with a locating hole 41 fitted into the the pin 32. These hole members 41 are brought into engagement with projected ends 70 of the connecting terminal plugs 2, respectively. The print pattern 71 extends to the peripheral edge of board 4.

The display panel 5 is formed in the upper surface thereof with a display window 51, adjacent to which is provided a temperature-setting portion 52.

Projections 53 provided at corners in the rear surface of the display panel 5 are pillar-like portions 53 having an elasticity similar to the aforesaid pillars 33. Although not shown, these pillar-like portions 53 are respectively formed with crossed guide grooves in a vertical direction thereof likewise the base panel 3. Engaging windows 54 are bored in the guide grooves of portions 53.

Each of the circuit boards 6 has a print pattern connected to the print pattern 72 formed in the base board 4. Electronic parts not shown are mounted on the board. The circuit board 6 is formed at both upper and lower sides with engaging projections 61, engaged between the pillar-like portions 33, and 53.

These engaging projections 61 have the width set somewhat larger than the spacing between opposing guide grooves of the opposed pillar-like portions. The four corners of projections 61 are cut so that they have a taper in the inserting direction and have a stepped portion to be engaged by the engaging shoulder 35 or engaging window 54 upon completion of insertion.

Next, the procedure for assembling parts designed as shown in FIG. 1 will be described.

First, the base board 4 is fitted into the inner bottom of the base panel 3, and the plugs 2 are made to be projected on the base board 4 and then soldered.

Next, the circuit boards 6 are inserted into the guide grooves 34 of the pillar-like portions 33. The pillar-like portions 33 are subjected to elastic distortion and spread outwardly by the engaging projections 61 on both sides of the circuit boards. Subsequently, the when engaging stepped portions of the engaging projections 61 come into abutment with the engaging shoulders 35 at the lower end of the guide grooves 34. The pillar-like portions are resiliently returned to their original state as shown in FIG. 2(b). Engaging shoulders 35 come into engagement with the engaging stepped portions and the extreme end of the circuit board 6 comes into abutment with base board 4. This locks the boards 6, the base board 4, and the base panel 3 together. At the same time, the print pattern formed on the base board 4 is placed in contact with the print pattern formed in each of the circuit boards 6. These print patterns are soldered together whereby the terminal plugs 2 are connected to the circuit board 6 through the base board 4.

Next, after the circuit boards 6 are locked on the base panel 3, the upper engaging portions 61 of the circuit board 6 are inserted into the pillar-like portions 53 of the display panel 5. The pillar-like portions 53 are subjected to outward elastic distortion by the engaging projections 61 in a manner as previously described. The stepped portions at the rear end thereof come into abutment with the engaging windows 54. Thereby, the pillar-like portions 53 resiliently return to their original state. The engaging projections 61 are prevented from being disengaged from the display panel 5 in the state where the projections 61 are projected from the engaging windows 54. As a consequence, the panels 3 and 5 are connected together through the circuit boards 6.

FIG. 3 shows the assembled state. The base panel 3 and the display panel 5 are integrally connected through the circuit boards 6. Assembly 73, (in the state where various parts are integrally assembled), is inserted through the opening in the front surface of the case 1. Then, the engaging projections 31 of the base panel 3 are inserted into abutment with the inner peripheral walls of the case 1. When completely inserted, the engaging projections 31 resiliently enter into the engaging holes 12 for anti-disengagement. At the same time, the peripheral edge in the rear surface of the display panel 5 comes into abutment with the end of the flange 11 to locate the extreme end thereof. This completes assembly of the plug-in type temperature controller.

In the above-described embodiment, each of the pillar-like portions 33 and 53 is provided with a crossed guide groove. Accordingly, the circuit boards 6, can be fitted not only in the direction shown in the figures but in the state where they are rotated through 90°. Accordingly, in the present embodiment the display surface of the display panel 5 relative to the base panel 3 may be changed by 90 degrees. The arrangement of the boards can be changed without newly fabricating a base panel, or a display panel. The parts can be standardized because of the plurality of assembly configurations.

What is claimed is:

1. An assembly having electronic apparatus housed in a case having openings at both ends, comprising;
    a pair of panels having a configuration corresponding to the configuration of said case openings, each panel having four pillar-like portions which are projectionly provided one on each of the four corners of the panel surface;
    said each pillar-like portion having a guide groove and an engaging shoulder;
    circuit boards, composed as a part of said electronic apparatus, integrally connecting said panels, each circuit board having engaging portions at four corners which are engagedly inserted into said pillar guide grooves and which come into abutment with said engaging shoulders for engagement;
    said pillar-like portions being subjected to elastic distortion as said engaging portions are inserted into said guide grooves and resiliently returing to their original state to bring said engaging shoulders into abutment with said engaging portions when said engaging portions are fully inserted into said guide grooves; and
    said circuit boards and panels are inserted and housed in said case, whereby said panels cover said case openings and provide surfaces for mounting display panels, controls and/or external terminals of said electronic apparatus, respectively.

2. An assembly according to claim 1 wherein said guide groove of each of said pillar-like portions is a crossed guide groove provided along the length of said pillar-like portions.

3. An assembly according to claim 1 wherein said engaging shoulder of said pillar-like portions formed on one of said pair of panels is formed by cutting a base portion of said pillar-like portions.

4. An assembly according to claim 1 wherein said engaging shoulder of said pillar-like portions formed on one of said pair of panels comprises a window in the guide groove of each pillar-like portion.

5. An assembly according to claim 1 wherein said engaging portions of said circuit boards have a width set somewhat larger than the spacing between opposing guide grooves of each of said pillar-like portions, and four corners of said circuit boards are cut into a tapered configuration in an inserting direction and have a stepped portion engaged by said engaging shoulder in the state where insertion is completed.

6. An assembly according to claim 1 wherein one side of one of said pair of panels has a first engaging portion,
    said case being formed with a second engaging portion complemental to said first engaging portion, and
    said first and second engaging portions being brought into springing engagement with each other.

* * * * *